(12) United States Patent
Bhavnagarwala et al.

(10) Patent No.: US 6,791,886 B1
(45) Date of Patent: Sep. 14, 2004

(54) SRAM CELL WITH BOOTSTRAPPED POWER LINE

(75) Inventors: Azeez J. Bhavnagarwala, Newtown, CT (US); Stephen V. Kosonocky, Wilton, CT (US); Rajiv V. Joshi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/448,723

(22) Filed: May 30, 2003

(51) Int. Cl.[7] .............................................. G11C 16/04
(52) U.S. Cl. ..................... 365/189.09; 365/154; 365/228
(58) Field of Search .......................... 365/189.09, 154, 365/227, 228

(56) References Cited

U.S. PATENT DOCUMENTS 6,388,936 B2 * 5/2002 Itoh et al. ................... 365/227
6,515,893 B1 * 2/2003 Bhavnagarwala ........... 365/154
6,529,400 B1 * 3/2003 Bhavnagarwala et al. .. 365/154
6,556,471 B2 * 4/2003 Chappell et al. ............ 365/154
2003/0043618 A1 * 3/2003 Nakura et al. .............. 365/154

* cited by examiner

Primary Examiner—Anh Phung
Assistant Examiner—Toan Le
(74) Attorney, Agent, or Firm—Thu Ann Dang; Keusey, Tutunjian & Bitetto, P.C.

(57) ABSTRACT

A memory cell includes at least one active device for selectively connecting a supply voltage node to a power line. The power line couples capacitive elements through the at least one active device to the supply voltage node to maintain a high state while accessing a storage node. The high state is provided by a boost created by the addition of the capacitive elements.

29 Claims, 2 Drawing Sheets

SRAM CELL WITH BOOTSTRAPPED POWER LINE

BACKGROUND OF THE INVENTION

1. Field of the Invention

The present invention relates to electronic data storage devices, and more particularly to a system and method for bootstrapping a power line in a data storage cell to provide a power boost in a memory cell.

2. Description of the Related Art

Static memory storage devices are subjected to more constraints at low voltages. With the portability of active or switching memory devices, power becomes a greater concern with higher performance requirements since power levels are generally lower and limited by portable power storage devices. These difficulties make the design of storage cells for portable applications more challenging.

For example, designing complementary metal oxide semiconductor (CMOS) static random access memory (SRAM) cells for high performance becomes particularly challenging at low power supply voltages, which are typically employed for portable applications. The data stored in a cell becomes increasingly vulnerable to a read upset at these low power voltages. In addition, the scalability of the supply voltage is also limited for conventional CMOS SRAM cells, due to dopant fluctuations in small-geometry cell transistors.

SUMMARY OF THE INVENTION

A memory cell includes at least one active device, for example a PFET, for selectively connecting a supply voltage node to a power line preferably during a standby state. The power line couples capacitive elements through the at least one active device to the supply voltage node to maintain a boosted voltage.

In another embodiment, a memory cell includes a storage node, and a first device for selectively connecting a supply voltage node to a power line through the storage node. The power line couples capacitive elements to the supply voltage node to hold a state while accessing the storage node.

In yet another embodiment, a random access memory cell includes a storage node which stores charge in accordance with a state of a bit line and an activation of a wordline, and a CMOS device having gates of an NFET and a PFET connected to the storage node. A power line provides capacitive coupling to the wordline such that upon activation of the wordline the PFET conducts to augment a state of a supply voltage to boost the state of the storage node.

Other embodiments may include the following features or elements. The wordline may be formed on a first layer of a semiconductor device and the power line may be formed on an adjacent layer. The wordline may be separated by a predetermined distance from the power line to provide the capacitive coupling therebetween, and the wordline is preferably separated from the power line by a dielectric material selected to provide an appropriate capacitive coupling therebetween.

The capacitive coupling may include capacitive components, for example, capacitance between the wordline and the power line, and/or capacitance between the power line and ground. The capacitive coupling preferably provides a voltage of greater than Vdd when maintaining data on the storage node. The capacitive coupling may include a voltage equal to $Vdd(C_c/(C_c+C_M))$, where $C_c$ is the capacitance between the wordline and the power line, and $C_M$ is the capacitance to ground of the power line.

These and other objects, features and advantages will become apparent from the following detailed description of illustrative embodiments thereof, which is to be read in connection with the accompanying drawings.

BRIEF DESCRIPTION OF DRAWINGS

The following disclosure will be describe in detail preferred embodiments with reference to the following figures wherein.

DETAILED DESCRIPTION OF PREFERRED EMBODIMENTS

The exemplary embodiments described herein provide cell arrangements and methods for operation thereof for memory devices. The present disclosure includes a memory cell arrangement having a power line bootstrapped to capacitive elements in the cell to provide a power boost to the supply voltage. The present disclosure is applicable to a wide range of technologies, but is particularly suited for 6T CMOS SRAM cells and beyond. The present disclosure advantageously "fakes" a higher supply voltage for a given low power supply voltage. This enables the memory cell to operate with a much lower supply voltage for a prescribed performance and static noise margin.

Performance testing performed by the inventors has yielded surprising results. The embodiments of the present disclosure increase cell performance by at least 20% over the prior art structure. The dramatic increase in performance is further increased by a cell stability of at least 60% during a read access operation. Read access operations are conventionally vulnerable to read upset.

Figure 1:
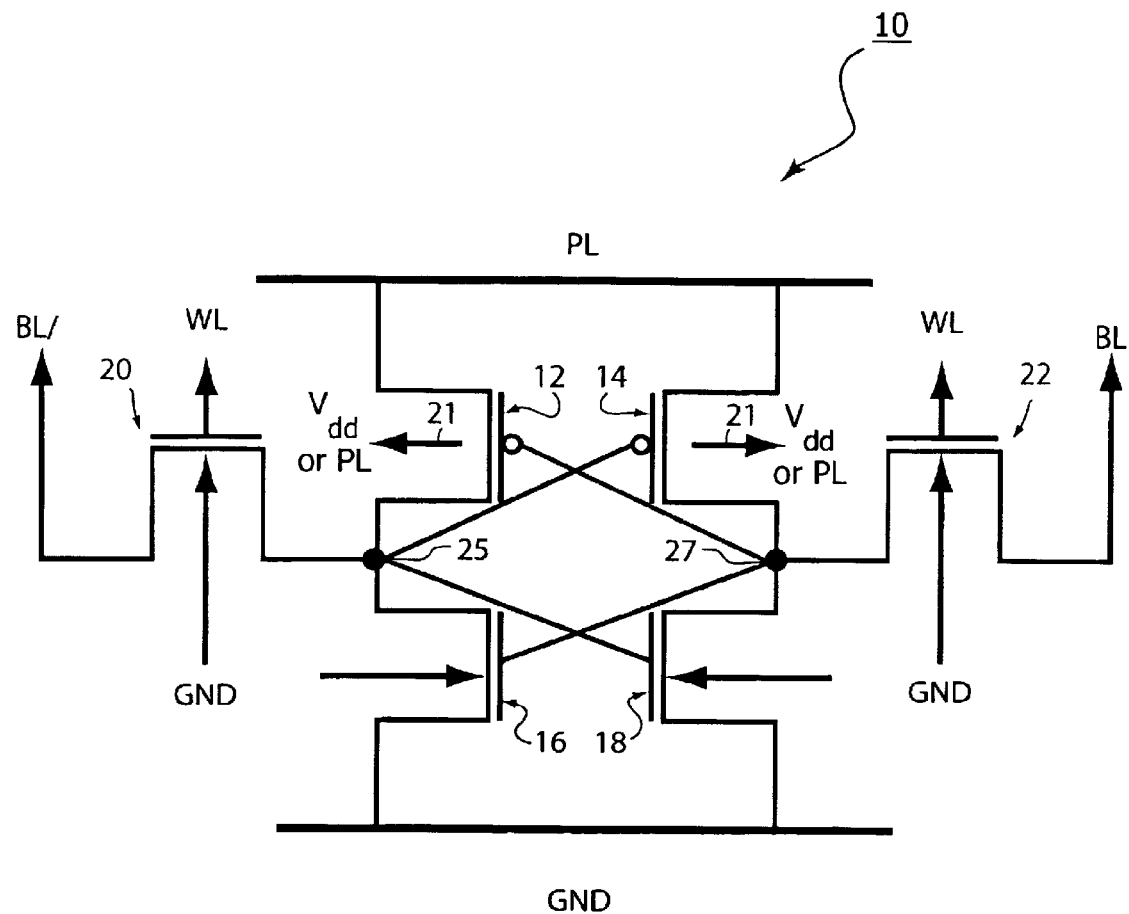
FIG. 1 is a schematic diagram showing a SRAM cell with two storage nodes being coupled to a power line in a bootstrap action in accordance with one embodiment.

Referring now in detail to the figures in which like numerals represent the same or similar elements and initially to FIG. 1, an SRAM cell 10 is shown in accordance with one illustrative embodiment. Cell 10 includes two PFETs 12 and 14 and two NFETs 16 and 18. The gates of PFET 12 and NFET 16 connect to a drain of an NFET 22, and the gates of PFET 14 and NFET 18 connect to a drain of an NFET 20. The gates of NFETs 20 and 22 form or are part of a wordline WL. Bitlines BL/ and BL connect to sources of NFETs 20 and 22.

A power line is typically strapped to a supply voltage, e.g., Vdd. However, in accordance with the present disclosure, a power line PL is driven above a supply voltage, Vdd by a wordline (WL) transition using a bootstrap action as will be described hereinbelow. The boost in power line PL may be given by the following relationship:

$$V_{boost} = Vdd(C_c/(C_c+C_M))$$

where $C_c$ is the coupling capacitance between wordline WL and power line PL, and $C_M$ is the capacitance to ground of power line PL.

The "bootstrap action" of the present disclosure is enabled by placing power line PL in sufficient proximity of wordline WL to provide enough capacitive coupling to provide a voltage boost and/or restoration to Vdd, when appropriate, in the operation cycle of the memory cell. PFETs 12 and 14 ensure that power line PL restores to Vdd when wordline WL is deselected.

In addition, N-well contacts (shown as arrows 21) of SRAM cell 10 PFETs 12 and 14 are preferably connected to power line PL. However, contacts 21 may be connected to Vdd. Advantageously, this avoids a transient forward bias current across PFET junctions when the PFETs are in a boosted state. These transients are avoided as well when restoring PL to Vdd during standby.

When power from power line PL is to be drawn, for example, when a storage node 25 (or 27) is to be driven to a "1" or high value, power line PL is driven higher than Vdd by conduction through PFET 12 or PFET 14. A stronger "high" or "1" at storage node 25 (or 27) causes a stronger pull-down at NFET 16 or NFET 18. In this way, a larger electrical cell ratio and a larger cell read current are experienced and the benefits of the present disclosure are thereby realized. PL is therefore "boosted" above Vdd.

Figure 2:
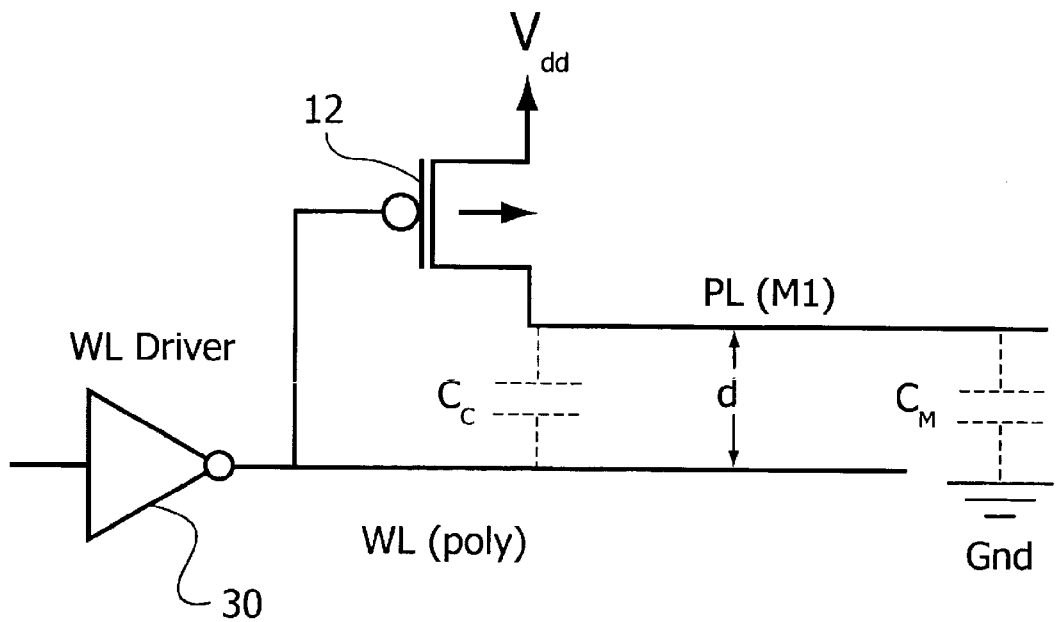
FIG. 2 is an illustrative schematic diagram showing the operation and configuration of one embodiment.

Referring to FIG. 2, a schematic diagram provides an illustrative model circuit to explain aspects of the present disclosure. A wordline driver or WL driver 30 drives a wordline WL. Wordline WL is connected to the gate of PFET 12 (or 14). When wordline WL is activated, PFET 12 is conducting thereby connecting power line PL to Vdd. Since wordline WL is in the vicinity of power line PL capacitive coupling ($C_c$) exists therebetween. In addition, a capacitive component ($C_M$) exists between power line PL and ground (Gnd). The capacitive components add in parallel to provide a current/voltage boost to Vdd (See e.g., FIG. 3).

It should be noted that power line PL does not necessarily provide power to the memory cell that stores the data, but holds a state in standby and boosts the "high" cell storage node to a higher voltage by virtue of capacitive coupling between WL and PL.

In one embodiment, wordline WL is formed near a surface of a semiconductor substrate on which it is formed. Wordline WL, for example, may be formed by patterning conductive or semiconductive polysilicon material. Wordline WL may be embedded below a surface of the substrate, or formed at or above a surface layer of the substrate. Power line PL is preferably formed on a layer adjacent to wordline WL. A distance "d" between WL and PL may be adjusted in a given design to provide appropriate capacitive coupling characteristic values.

In one example, PL is formed on an M1 metal layer, although PL may be formed on other layers to adjust the distance "d" between WL and the substrate (Gnd). For example, an M3 layer wordline may have a power line formed in an M4 layer.

It is to be understood, that capacitive coupling between layers may occur using any conductive materials (poly, metal, etc.) and may be employed between any layers (e.g., M2 and M3, etc.) of the device to achieve the desired effects of the present disclosure. In addition, a dielectric constant between capacitive components may be selected by choosing a material to provide desired capacitive characteristics.

In alternate embodiments, capacitive elements, such as $C_c$ and $C_M$ may include other components formed on a semiconductor chip. For example, additional metal features or regions may be employed to form capacitive elements or to adjust distance "d" between opposing capacitive regions.

Figure 3:
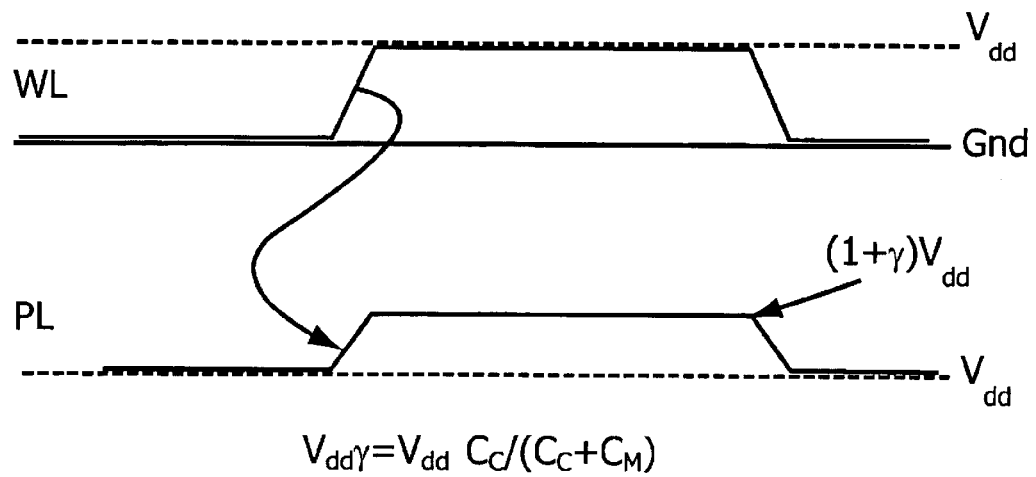
FIG. 3 is a signal/timing diagram showing a boosted voltage.

Referring to FIG. 3, a signal/timing diagram is shown to illustrate the bootstrapping or boost effect of the present disclosure. When WL goes "high" (e.g., to Vdd), PL is coupled to Vdd through PFET 12. Capacitively stored energy from $C_c$ and $C_M$ discharges to boost Vdd to $V_{boost}$ (Vddγ). So that $$V_{boost}=Vdd\gamma=Vdd(C_c/(C_c+C_M))$$

where Vddγ=(1+γ)Vdd and γ represents the increase in magnitude of Vdd in accordance with the present disclosure.

Simulations performed by the inventors have indicated substantial improvements over the prior art. For example, in one simulation device, delay was reduced from 201 ps for conventional memory cells (using Vdd) while a delay of 163 ps was achieved for the memory cells in accordance with the present disclosure (Vddγ). In addition, cell stability increased dramatically especially during read access cycles when data from a storage node is read from the cells.

The embodiments described herein find application in any storage cell device, and is particularly useful in any regular structure such as register files or in applications where high fan-out cells are selected by a common driver and powered by a common rail.

In accordance with the present disclosure, higher performance is achieved by supplying a larger supply voltage when the cell is accessed. This permits a larger gate overdrive to pull-down an NFET to enable it to sink a larger read current. Lower power is needed since a lower supply voltage may now be employed for a same read current.

In addition, higher cell stability is achieved. The cell is most vulnerable to noise when a wordline is turned on. Boosting a cell storage node voltage during this period significantly increases the cell immunity to all sources of static noise, for example, mismatches, asymmetries, misalignments, etc.

Having described preferred embodiments of an SRAM cell with bootstrapped power line system and method (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the append claims. Having thus described the invention with the details and particularity required by the patent laws, what is claimed and desired protected by Letters Patent is set forth in the appended claims.

What is claimed is:

1. A memory cell comprising:
   at least one active device for selectively connecting a supply voltage node to a power line; and
   the power line for coupling capacitive elements through the at least one active device to the supply voltage node to maintain a boosted state during memory operations.

2. The memory cell as recited in claim 1, wherein the at least one active device includes a field effect transistor.

3. The memory cell as recited in claim 1, wherein the at least one active device includes a CMOS device.

4. The memory cell as recited in claim 1, wherein a wordline is formed on a first layer of a semiconductor device and the power line is formed on an adjacent layer.

5. The memory cell as recited in claim 1, wherein a wordline is separated by a distance from the power line to provide capacitive coupling therebetween.

6. The memory cell as recited in claim 5, wherein the capacitive coupling includes a capacitance between the wordline and the power line.

7. The memory cell as recited in claim 5, wherein the capacitive coupling includes a capacitance between the power line and ground.

8. The memory cell as recited in claim 1, wherein a wordline is separated from the power line by a dielectric material selected to provide an appropriate capacitive coupling therebetween.

9. The memory cell as recited in claim 1, wherein the capacitive elements provide a voltage of greater than Vdd when accessing or writing data to a storage node.

10. The memory cell as recited in claim 9, wherein the capacitive elements provide a voltage equal to $Vdd(C_c/(C_c+C_M))$, where $C_c$ is the capacitance between the wordline and the power line, and $C_M$ is the capacitance to ground of the power line.

11. A memory cell comprising:
a storage node;
a first device for selectively connecting a supply voltage node to a power line through the storage node;
the power line couples capacitive elements to the supply voltage node to hold a state while accessing the storage node.

12. The memory cell as recited in claim 11, wherein the first device includes a field effect transistor.

13. The memory cell as recited in claim 11, wherein the first device includes a CMOS device.

14. The memory cell as recited in claim 11, wherein a wordline is formed on a first layer of a semiconductor device and the power line is formed on an adjacent layer.

15. The memory cell as recited in claim 11, wherein a wordline is separated by a distance from the power line to provide capacitive coupling therebetween.

16. The memory cell as recited in claim 15, wherein the capacitive coupling includes a capacitance between the wordline and the power line.

17. The memory cell as recited in claim 15, wherein the capacitive coupling includes a capacitance between the power line and ground.

18. The memory cell as recited in claim 11, wherein a wordline is separated from the power line by a dielectric material selected to provide an appropriate capacitive coupling therebetween.

19. The memory cell as recited in claim 11, wherein the capacitive elements provide a voltage of greater than Vdd when maintaining data on the storage node.

20. The memory cell as recited in claim 19, wherein the capacitive elements provide a voltage equal to $Vdd(C_c/(C_c+C_M))$, where $C_c$ is the capacitance between the wordline and the power line, and $C_M$ is the capacitance to ground of the power line.

21. A random access memory cell, comprising:
a storage node which stores charge in accordance with a state of a bit line and an activation of a wordline;
a CMOS device having gates of an NFET and a PFET connected to the storage node; and
a power line providing capacitive coupling to the wordline such that upon activation of the wordline the PFET conducts to augment a state of a supply voltage to boost the state of the storage node.

22. The memory cell as recited in claim 21, wherein the NFET conducts to provide pull-down in accordance with the boost in the supply voltage.

23. The memory cell as recited in claim 21, wherein the wordline is formed on a first layer of a semiconductor device and the power line is formed on an adjacent layer.

24. The memory cell as recited in claim 21, wherein the wordline is separated by a distance from the power line to provide the capacitive coupling therebetween.

25. The memory cell as recited in claim 21, wherein the wordline is separated from the power line by a dielectric material selected to provide an appropriate capacitive coupling therebetween.

26. The memory cell as recited in claim 21, wherein the capacitive coupling includes a capacitance between the wordline and the power line.

27. The memory cell as recited in claim 21, wherein capacitive coupling includes a capacitance between the power line and ground.

28. The memory cell as recited in claim 21, wherein the capacitive coupling provides a voltage of greater than Vdd when maintaining data on the storage node.

29. The memory cell as recited in claim 28, wherein the capacitive coupling provides a voltage equal to $Vdd(C_c/(C_c+C_M))$, where $C_c$ is the capacitance between the wordline and the power line, and $C_M$ is the capacitance to ground of the power line.

* * * * *